United States Patent
Gillman et al.

(10) Patent No.: US 8,930,083 B2
(45) Date of Patent: Jan. 6, 2015

(54) ELECTRIC POWER STEERING SYSTEM HAVING FAIL-SAFE CONTROL MODULE OPERATION

(75) Inventors: Stephen Gillman, Grand Blanc, MI (US); John R. Hoffman, Birch Run, MI (US); Brian T. Murray, Novi, MI (US); Wayne B. Thomas, Saginaw, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 956 days.

(21) Appl. No.: 12/543,113

(22) Filed: Aug. 18, 2009

(65) Prior Publication Data

US 2010/0049403 A1 Feb. 25, 2010

Related U.S. Application Data

(60) Provisional application No. 61/189,972, filed on Aug. 25, 2008.

(51) Int. Cl.
| | | |
|---|---|---|
| *A01B 69/00* | (2006.01) | |
| *B62D 6/00* | (2006.01) | |
| *B62D 12/00* | (2006.01) | |
| *B62D 11/00* | (2006.01) | |
| *B63G 8/20* | (2006.01) | |
| *B63H 25/04* | (2006.01) | |
| *G05D 1/00* | (2006.01) | |
| *G06F 7/00* | (2006.01) | |
| *G06F 17/00* | (2006.01) | |
| *G06F 19/00* | (2011.01) | |
| *H05K 1/02* | (2006.01) | |
| *B62D 5/04* | (2006.01) | |
| *H05K 5/06* | (2006.01) | |
| *H05K 3/28* | (2006.01) | |

(52) U.S. Cl.
CPC ............ *H05K 1/0268* (2013.01); *B62D 5/0406* (2013.01); *B62D 5/0481* (2013.01); *H05K 5/064* (2013.01); *H05K 3/284* (2013.01); *H05K 2201/09781* (2013.01); *H05K 2201/0989* (2013.01); *H05K 2203/163* (2013.01)
USPC ............... 701/43; 701/41; 340/465; 340/507; 361/765

(58) Field of Classification Search
USPC .................. 701/36, 41, 43, 45; 340/465, 507; 342/71; 361/321.3, 705, 751, 765, 539; 427/58, 63, 71, 96.1, 104
See application file for complete search history.

(56) References Cited

U.S. PATENT DOCUMENTS 6,078,155 A * 6/2000 Tominaga et al. ............ 318/293
7,481,293 B2 * 1/2009 Ogawa et al. ................. 180/443
(Continued)

FOREIGN PATENT DOCUMENTS

DE 10249370 A1 * 5/2004 ............. B60R 16/02

OTHER PUBLICATIONS

English Translation of DE 10249370 A1.*

*Primary Examiner* — Rami Khatib
(74) *Attorney, Agent, or Firm* — Cantor Colburn LLP

(57) ABSTRACT

An electric power steering system is provided. It comprises a steering assist assembly and a motor assembly that actuates the steering assist assembly. A control module that provides steering assist commands to the motor assembly, the control module including a circuit board having a first portion having circuits thereon and a second portion that includes at least one sensor circuit that receives signals from at least one sensor subsystem. A potting material coats only the first portion of the circuit board.

14 Claims, 4 Drawing Sheets

(56) References Cited

U.S. PATENT DOCUMENTS

| | | |
|---|---|---|
| 7,538,560 B2 | 5/2009 | Hepner et al. |
| 7,568,400 B2 * | 8/2009 | Tokumoto et al. ....... 73/862.333 |
| 2002/0020230 A1 * | 2/2002 | Opie et al. ............... 73/862.333 |
| 2003/0071446 A1 * | 4/2003 | Haderer et al. ............... 280/735 |
| 2004/0031339 A1 * | 2/2004 | Swanson et al. ............. 73/865.9 |
| 2005/0011254 A1 * | 1/2005 | Swanson et al. ............. 73/49.3 |
| 2007/0159755 A1 * | 7/2007 | Talbot et al. ................. 361/115 |
| 2008/0158823 A1 * | 7/2008 | Tominaga et al. ............ 361/709 |
| 2009/0294165 A1 * | 12/2009 | Thomas ........................ 174/263 |

\* cited by examiner

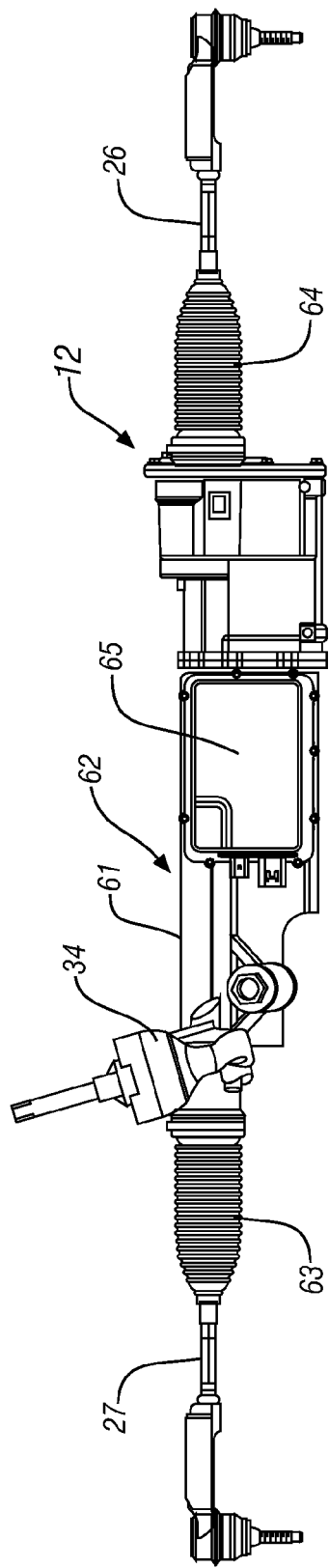
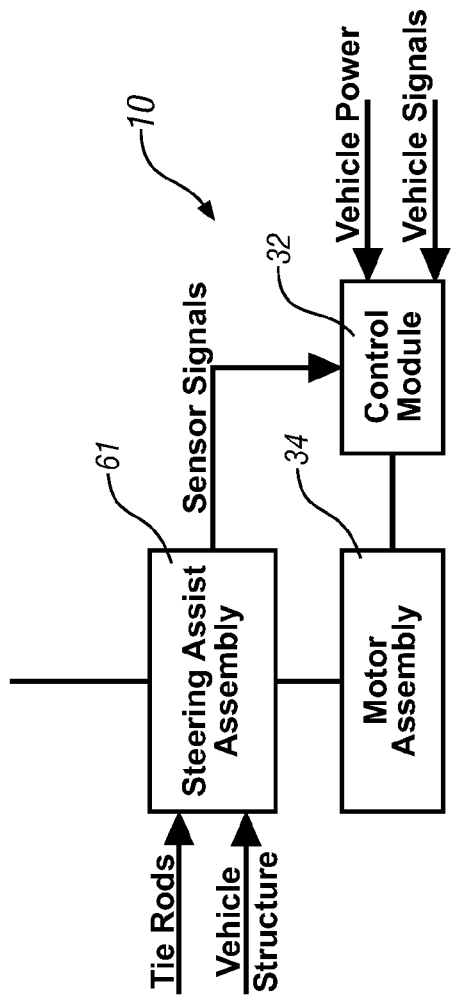
FIG. 2
FIG. 3

ELECTRIC POWER STEERING SYSTEM HAVING FAIL-SAFE CONTROL MODULE OPERATION

CROSS REFERENCE TO RELATED APPLICATIONS

This application claims priority to U.S. Provisional Application Serial No. 61/189,972, filed Aug. 25, 2008, the contents of which are incorporated by reference herein.

BACKGROUND OF THE INVENTION

Embedded systems contain electronic circuits that control products or processes. These systems are subjected to a variety of environmental conditions, including moisture. In most cases, the control electronics are implemented using technology that cannot tolerate environmental contamination without negative effects. At the same time, it might be important to know whether environmental contamination is present in order for the control module to execute a fail-safe mechanism, such as a warning or controlled shutdown of the plant under control.

As an example, many embedded control systems are implemented using printed circuit boards (PCBs) that contain multiple layers of insulating substrate. Each layer has a deposited ("printed") set of conductors, usually made of metal representing wires that carry signals or power. The layers are glued together to form a single board that is populated on the external surfaces with integrated circuits. If moisture contacts these layers, thin whiskers of metal called dendrites can form between the conductors potentially leading to bridging faults (short circuits) between the conductors. If two shorted conductors carry signals, the resulting signal carried by either or both of the shorted conductors may be unpredictable. Thus, the function performed by the controller would be unpredictable. If the conductors carry power, the short can lead to melting or even ignition of the PCB.

Furthermore, if the embedded system is safety-relevant, that is, the safety of the product depends on the hazard-free operation of the controller, then contamination of the controller electronics must be monitored and controlled. To prevent damage to the electronics in an embedded system caused by environmental contamination, collisions or other causes, the electronics are typically enclosed and/or sealed in a case or housing. Often this single layer of protection is not sufficient to prevent environmental contamination and additional inner layers are necessary. A typical solution to the problem of inner layer protection is to cover the controller PCB with a protective coating, such as an electronics potting compound made of silicone or polyurethane.

For safety-relevant systems it is sometimes important to know if contamination has occurred, even if the protective layers have prevented the contamination from negatively affecting the embedded controller.

One solution to the problem of detecting the contamination is to add a sensor, e.g., a moisture sensor in the case where water contamination is to be detected. A similar approach, appropriate in cases where environmental conditions can cause premature aging of components, is to monitor a redundant component or circuit with slightly greater sensitivity than the primary circuit. A failure in the redundant circuit indicates environmental conditions that could adversely affect the primary circuit. Such redundant circuits are frequently called canary circuits. However, both of these solutions add cost, complexity and potentially unreliability due to the additional components.

SUMMARY OF THE INVENTION

According to one aspect of the invention, an electric power steering system is provided. It comprises a steering assist assembly and a motor assembly that actuates the steering assist assembly. A control module that provides steering assist commands to the motor assembly, the control module including a circuit board having a first portion having circuits thereon and a second portion that includes at least one sensor circuit that receives signals from at least one sensor subsystem. A potting material coats only the first portion of the circuit board.

According to another aspect of the invention, an electronic embedded system having a subsystem to detect contamination is provided. It comprises a control module including a circuit board having a first portion that includes a plurality of circuits and a second portion that includes at least one exposed circuit. A potting material coats only the first portion of the circuit board.

In accordance with yet another aspect of the invention, a method of protecting an electronic embedded system is provided. It comprises a control module including a circuit board having a plurality of circuits for implementing the system. At least one subset of the plurality of circuits being a canary subsystem, the circuit board coated with a potting material. The method includes monitoring the canary subsystem for environmental contamination and sending a signal to the control module when the environmental contamination is detected. The embedded system is placed into a safe mode in response to the signal.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 2 is an elevation view of a rack and pinion steering system in accordance with the invention;

FIG. 3 is a schematic diagram in accordance with the invention;

DETAILED DESCRIPTION

Figure 1:
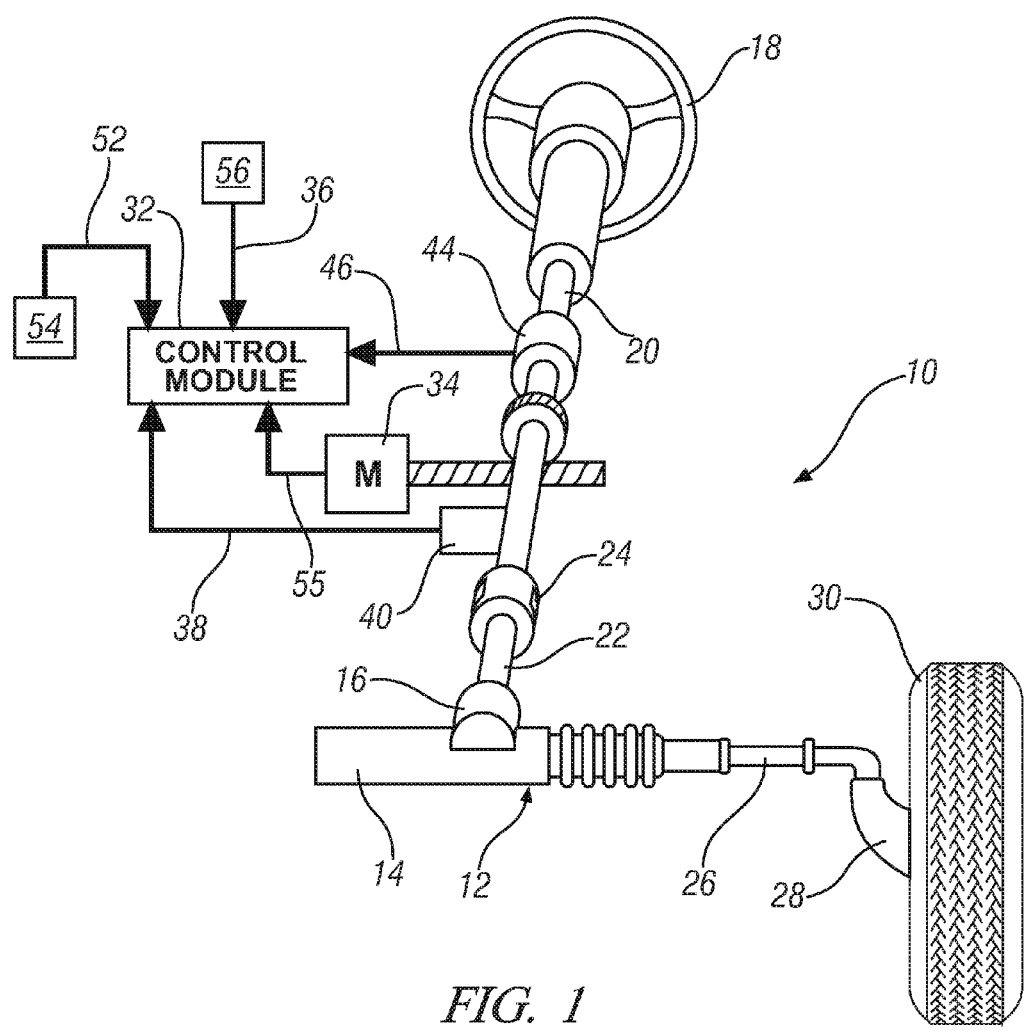
FIG. 1 is a pictorial view of a power steering system in accordance with the invention.

Referring now to the Figures, where the invention will be described with reference to specific embodiments, without limiting same, FIGS. 1 through 3 show portions of a power steering system 10 for a motor vehicle. Power steering system 10 may be an electric power steering system and comprises a conventional rack and pinion steering mechanism 12 that includes a toothed rack 14 and a pinion gear (not shown) disposed within a gear housing 16. A handwheel or steering wheel 18 is disposed on an upper steering shaft 20 and is accessible by an operator (not shown) of the motor vehicle. Upon rotation of handwheel 18, upper steering shaft 20 turns a lower steering shaft 22 through a universal joint 24. Lower steering shaft 22 turns the pinion gear. Rotation of the pinion gear causes the lateral translation of rack 14 back and forth, which in turn moves tie rods 26 and 27, each of which move steering knuckles 28 (only one of which is shown), thereby causing movement of at least one steerable wheel 30 to steer the motor vehicle.

Power assist is provided through a controller or control module 32 and a power assist actuator comprising an electric motor assembly 34. In various embodiments, the controller or control module 32 can include one or more sub-modules and datastores. As used herein the terms module and sub-module refer to an application specific integrated circuit (ASIC), an electronic circuit, a processor (shared, dedicated, or group) and memory that executes one or more software or firmware programs, a combinational logic circuit, and/or other suitable components that provide the described functionality. Control module 32 receives electric power from a vehicle electric power source (not shown), a vehicle velocity signal 36 from a vehicle velocity sensor 56. As handwheel 18 is turned, a torque sensor 44 senses the torque applied to hand steering device 18 by the operator and provides a torque signal 46 to control module 32, whereupon control module 32 determines the amount and direction of additional torque needed, using data from sensors 56 and 44. In addition, as the rotor of motor 34 turns, rotor position signals for each phase are generated within motor 34 and are transmitted to control module 32.

Furthermore, power steering system 10 might also include a steering pinion gear angle signal 38 from a rotational position sensor 40 and a yaw angular velocity value signal 52 from an acceleration sensor 54. In response to control module 32 receiving vehicle velocity signal 36, yaw angular velocity value signal 52, and steering pinion gear angle signal 38, control module 32 derives the desired motor currents and provides such currents to motor 34 in the form of an output signal 55, that can be used to further control power steering system 10 to maintain stability and comfort of the motor vehicle.

With reference to FIGS. 2 and 3, one embodiment of the present invention provides rack and pinion steering mechanism 12 as a rack-type electric power steering (EPS) assist gear assembly 61. Gear assembly 61 includes a sealed steering actuator 62 disposed between a pair of flexible boots 63 and 64. Sealed steering actuator 62 includes therein at least toothed rack 14 and pinion gear (not shown). In the embodiment shown, an integral sealed housing 65 is attached to gear assembly 61, housing 65 containing control module 32 therein. The control module 32, attached to EPS assist gear assembly 61 is located under the hood of the vehicle, where housing 65 is subjected to extreme temperatures, moisture and corrosive elements. The sealing of the housing 65 can be breached if, for example, one of flexible boots 63 or 64 becomes cut or torn, or a gasket that seals housing 65 fails. Failure could permit water, dust, dirt, salt or other contaminating elements, all of which comprise environmental contamination, to enter housing 65.

As will be seen by referring to FIGS. 1 and 3, power steering system 10 operates in the following manner. As the driver turns the steering wheel 18, a processor in control module 32 determines the amount and direction of additional torque needed, using data from torque sensor 44 and vehicle velocity sensor 56. The motor assembly 34 applies the commanded torque to the EPS steering assist assembly 61 and steering actuator 62. This applied torque assists the driver in overcoming the torque developed by the vehicle structure, such as the chassis, during a steering maneuver.

The control module 32 also constantly receives at least a vehicle velocity signal 36 and other vehicle signals from other vehicle systems. Using these input signals, along with other sensor signals and the battery supply voltage, algorithms within control module 32 perform control functions. In addition to computing the proper assist torque for power steering system 10, control module 32 is responsible for system initialization and shutdown procedures. Control module 32 also executes steering system diagnostic routines, and is responsible for the detection of failures and placing the system into a condition of safe operation when required. The safe state, as will be described herein, in one embodiment, is designed to inhibit the motor assembly 34 from being able to apply force, either driving or restraining, to steering system 10.

Figure 4:
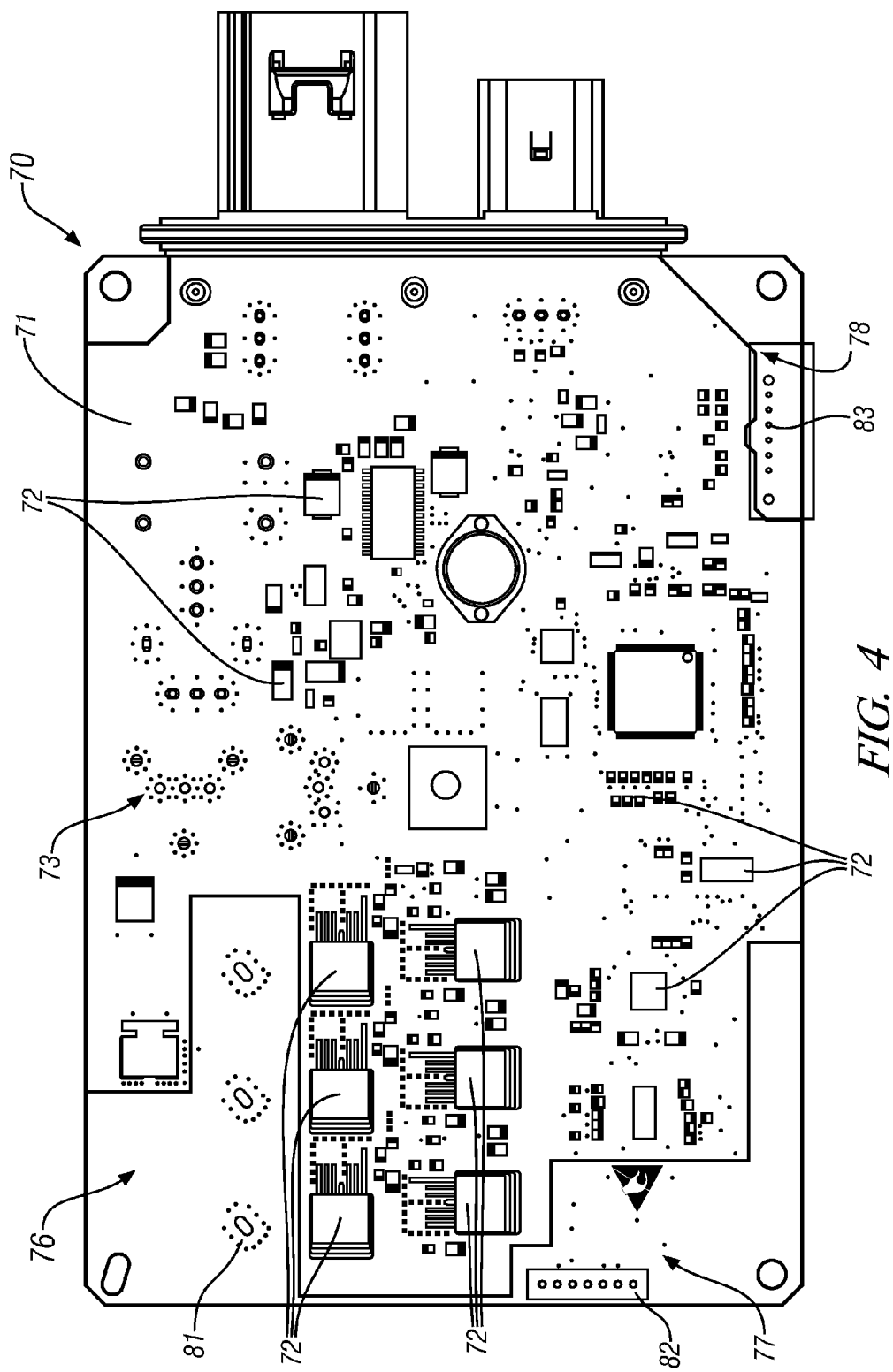
FIG. 4 is a schematic diagram of a circuit board in accordance with the invention.
Figure 5:
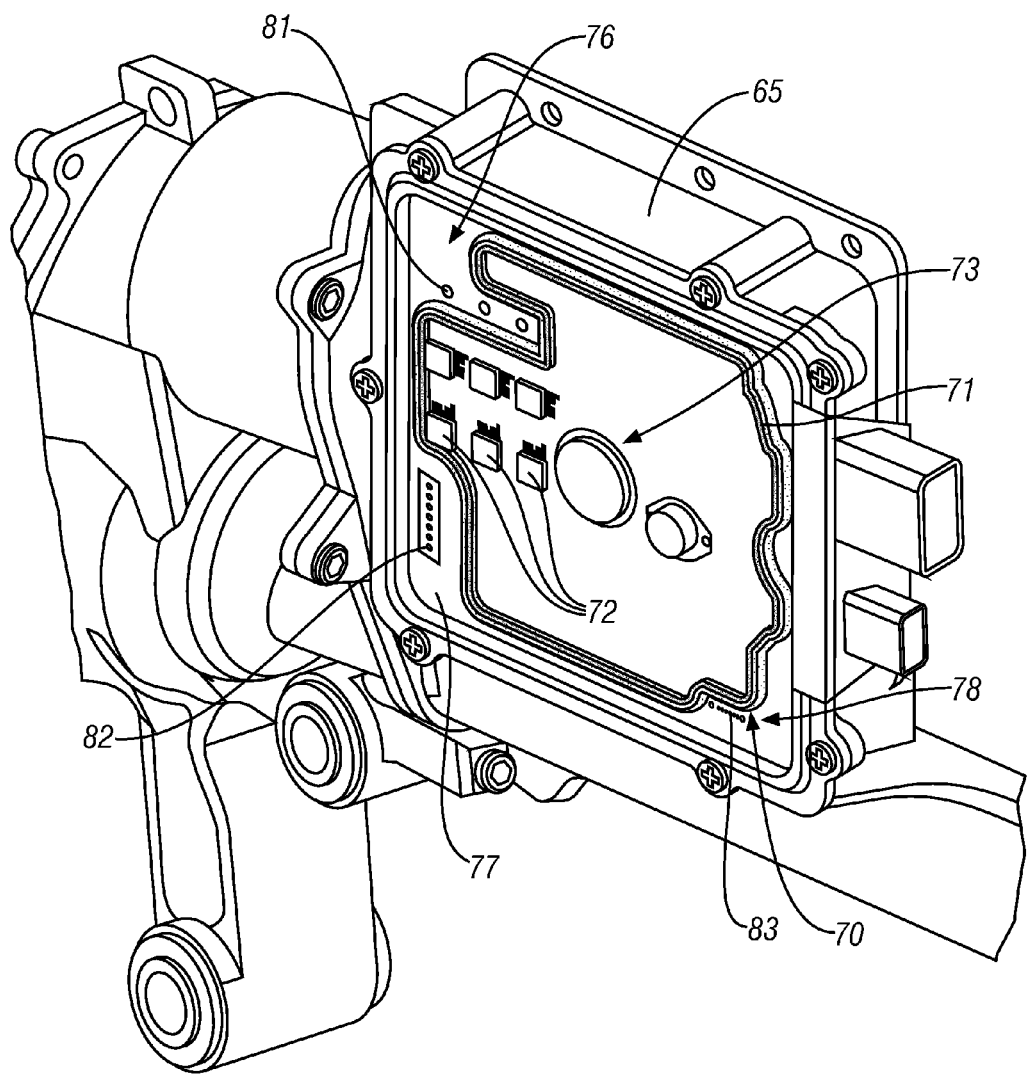
FIG. 5 is a partial cut-away view of the rack and pinion steering system in accordance with the invention.

Referring now to FIGS. 4 and 5, the control module 32 includes a printed circuit board (PCB) 70 whose entirety of surfaces are thoroughly coated with a potting material 71, including multiple circuits 72 on PCB 70, in a first portion area 73 to minimize the exposure of PCB 70 and the surfaces thereof, to moisture. As such, the entirety of PCB 70, front, back and edges, is sealed from contamination, except as described below. Contamination may comprise an environmental contamination or other disturbance (which can be any type of failure-causing stress such as vibration, contamination, interruption, intrusion, electromagnetic susceptibility, shock (mechanical or otherwise)). Potting material 71 may include, but is not limited to, materials such as RTV elastoplastic or silicone.

Second, third and fourth exposed portion areas 76, 77 and 78 of PCB 70, include sacrificial components, shown as fail safe canary circuits (unsealed or exposed circuits) 81, 82 and 83, respectively. They are not coated with potting material 71, leaving them unsealed, exposed and unprotected. Since unsealed or exposed circuits 81, 82 and 83 are uncoated by potting material 71, circuits 81, 82 and 83 are sensitive to contamination, but are not themselves vulnerable to any safety issues created by their exposure.

Each or all of the exposed circuits 81, 82 and 83 may comprise a subsystem that implements standard functions of control module 32, and more specifically a sacrificial subsystem. For example, exposed circuit 81 receives signals from at least one sensor subsystem, such as torque sensor 44 and torque signal 46. Exposed circuit 82 is capable of receiving signals from another sensor subsystem, such as a vehicle velocity signal 36 from vehicle velocity sensor 56. As is clear from these examples, the exposed circuits 81 and 82 provide critical function for power steering system 10 to function properly. As such, exposed circuits 81, 82 located on exposed portion areas 76 and 77, respectively are primary circuits performing primary functions for power steering system 10. Exposed circuits 81 and 82 are not redundant circuits that perform a function that duplicates the same function of control module 32.

Exposed circuits 81, 82, and 83 work together with multiple circuits 72 on PCB 70 and are serially connected together to provide a primary function of an embedded system. Thus, this serial composition of subsystems; a first subsystem (at least one of exposed circuits 81, 82 or 83) and a second subsystem (at least one of multiple circuits 72) form a system providing a primary function of an embedded system. In the serially connected subsystems, the output of the first subsystem is an input of the second subsystem, or vice versa. Damage to either subsystem by contamination, which as used herein may be an environmental contamination or a disturbance (which, as described above, can be any type of failure-causing stress such as vibration, contamination, interruption, intrusion, electromagnetic susceptibility, shock (mechanical or otherwise)) leads directly to the loss of the primary function of the system. After a failure, the invention allows either or both of the subsystems to continue to operate in safe mode.

As used herein, reference to a sacrificial component or a sacrificial subsystem refers to a component or subsystem left deliberately unprotected, or less protected, from contamination, disturbance or other conditions that could potentially adversely affect the component or subsystem. The operation of the subsystem will be affected in detectable ways as a result of the adverse conditions.

In certain other embodiments exposed circuits 81, 82 and 83 do not have to involve sensor subsystems, but can provide other processing, as shown in FIG. 3. Exposure of second, third or fourth portion areas 76, 77 or 78, respectively, to contamination is readily detectable by control module 32. Such exposure is generally caused by a contamination to PCB 70. A fail-safe operation is achieved since control module 32 continually monitors exposed circuits 81, 82 and 83. The control module 32 is immediately aware when exposed circuits 81, 82 or 83 fail to operate properly, such as when environmental contamination is detected. This happens because the signal that is received from one or more of exposed circuits 81, 82 or 83 is incorrect. As used herein an incorrect signal from exposed circuits 81, 82 or 83 means the signal is different than what is normally received by control module 32 or different than what is expected from exposed circuits 81, 82 or 83.

The exposed circuits 81, 82 and 83 maybe sacrificial and irrevocably fail due to their exposure to contamination, or alternatively, may merely be impaired when exposed to environmental contamination, such as moisture. Failure or impairment, may result in issuance of an audible or visual warning, result in a minor impairment of proper power steering system operation or performance or can alternatively shutdown the entire power steering system 10. The control module 32 continues to function and can send diagnostic information to the vehicle, but cannot reactivate the steering system 10 without restarting the vehicle. The driver is alerted to a problem in the electric power steering system 10, since the power assist function is removed and the vehicle is more difficult to steer. Importantly, this safe state still permits an average driver to steer the vehicle, as necessary, though with some additional extra effort.

It will be appreciated that a detected signal from exposed circuits 81, 82 or 83 that is incorrect, i.e. different than what is normally received can be indicative of a likely breach in the seal enclosing integral seal housing 65 that may lead to further, more serious or expensive failures of the steering system 10. By way of the use of exposed circuits 81, 82 and 83, an effective fail-safe operation is achieved. It allows a sufficient period of time between the initial detection of contamination and damage or failure of the embedded system to address the conditions arising due to exposed circuits 81, 82 and 83 failure -before contamination can cause failure of other vulnerable parts of control module 32 or other system parts.

It will be appreciated that the above described invention is not limited to power steering systems, but is applicable to any electronic embedded system in which it is desired to provide a fail-safe canary subsystem to detect contamination. Such a fail-safe canary subsystem will provide at least one essential function to the embedded system and is not redundant. If it is implemented as a redundant subsystem, when it fails, the embedded system can only operate in a degraded mode or must be reconfigured or restarted in order to continue to operate normally. The fail-safe canary subsystem will fail safely. As such, when the failures are detected, the embedded system reacts by taking an action that either preserves the function and signals a warning or creates a degraded but safe mode of operation. The embedded system becomes aware that the fail-safe canary subsystem has failed, as described above and, in one embodiment, has a time sufficient to react and maintain a safe mode of operation without allowing further component damage to the control module.

The fail-safe canary subsystem is designed to contribute to the normal functioning of the embedded system. In some embodiments, the fail-safe canary subsystem is viewed as a weak link in a chain. When exposed to environmental conditions or contamination that will eventually adversely affect the entire system, the fail-safe canary subsystem fails early.

A fail-safe canary subsystem has less design and manufacturing complexity compared to alternative approaches that add circuits specifically for detection since there are fewer circuits and diagnostics. Since there is less redundancy and fewer circuits to fail, there is improved reliability. This will lead to fewer false-detect scenarios.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

Having thus described the invention, it is claimed:

1. An electric power steering system comprising:
    a steering assist assembly;
    a motor assembly that actuates said steering assist assembly;
    a control module that provides steering assist commands to said motor assembly, said control module including a circuit board having a first portion having at least one protected circuit thereon and a second portion that includes at least one exposed sensor circuit that receives signals from at least one sensor subsystem; and
    a potting material coating only said first portion of said circuit board;
    the at least one exposed sensor circuit being unprotected from exposure to contamination;
    the at least one exposed sensor circuit connected to the at least one protected circuit so as to provide, together with the protected circuit, a primary function of the electric power steering system;
    the at least one exposed sensor circuit connected to the at least one protected circuit and configured to operate, together with the protected circuit, in a fail-safe mode following impairment of the at least one exposed sensor circuit;
    the fail-safe mode characterized in that, following impairment of the at least one exposed sensor circuit, the at least one exposed sensor circuit and the at least one protected circuit continue to provide said primary function and a warning is issued indicative of the at least one exposed sensor circuit being exposed to contamination.

2. The electric power steering system of claim 1, including a housing, said control module contained within said housing, said housing being sealed to prevent environmental contamination within said housing.

3. The electric power steering system of claim 1, wherein said at least one sensor subsystem includes a sensor that measures handwheel torque.

4. The electric power steering system of claim 3, wherein said at least one sensor subsystem includes a sensor that measures vehicle speed.

5. The electric power steering system of claim 1, wherein the second portion includes at least one circuit that receives signals from at least one vehicle system.

6. The electric power steering system of claim 1, wherein the control module initiates a safe operation prohibiting said motor assembly from applying force upon receiving a signal from said at least one exposed sensor circuit.

7. The electric power steering system of claim 1, wherein the control module monitors said at least one sensor subsystem to detect environmental contamination.

8. The electric power steering system of claim 1, wherein said primary function comprises executing one or more steering system diagnostic routines.

9. The electric power steering system of claim 1, wherein said fail-safe mode comprises inhibiting an application of a force by the motor assembly to actuate the steering assist assembly.

10. An electric power steering system for a vehicle, the system comprising:
- a steering assist assembly;
- a motor assembly that actuates the steering assist assembly;
- a control module that provides steering assist commands to the motor assembly, the control module including a circuit board having a first portion having at least one protected circuit thereon and a second portion that includes a first exposed sensor circuit that receives signals from a first sensor subsystem and a second exposed sensor circuit that receives signals from a second sensor subsystem; and
- a potting material coating only the first portion of the circuit board;
- the first and second exposed sensor circuits being unprotected from exposure to contamination;
- the first and second exposed sensor circuits connected to the at least one protected circuit so as to provide, together with the protected circuit, a primary function of the electric power steering system;
- the first and second exposed sensor circuits connected to the at least one protected circuit and configured to operate, together with the protected circuit, in a safe mode following impairment of at least one of the first and second exposed sensor circuits;
- the safe mode characterized in that, following impairment of at least one of the first and second exposed sensor circuits:
  - the impaired first and/or second exposed sensor circuit sends an abnormal condition signal to the control module;
  - the control module, based on receiving the abnormal condition signal, impairs the performance of the steering assist assembly or disables the steering assist assembly; and
  - a warning is issued to a driver of the vehicle to indicate that the steering assist assembly of the vehicle is impaired or disabled.

11. The electric power steering system of claim 10, wherein the control module is configured such that it cannot reactivate the steering assist assembly until the vehicle and/or the control module is restarted.

12. The electric power steering system of claim 10, wherein the first sensor subsystem is a torque sensor and the second sensor subsystem is a vehicle velocity sensor, the first exposed sensor circuit receiving a torque signal from the torque sensor and the second exposed sensor circuit receiving a vehicle velocity signal from the vehicle velocity sensor.

13. The electric power steering system of claim 12, further comprising a third exposed sensor circuit that receives signals from a third sensor subsystem, the third sensor subsystem being a rotational position sensor sending a pinion gear angle signal.

14. The electric power steering system of claim 13, further comprising a fourth exposed sensor circuit that receives signals form a fourth sensor subsystem, the fourth sensor subsystem being an acceleration sensor sending a yaw angle velocity value signal.

* * * * *